(12) United States Patent
Barkaro et al.

(10) Patent No.: US 8,588,403 B2
(45) Date of Patent: *Nov. 19, 2013

(54) ECHO CANCELING ARRANGEMENT

(75) Inventors: Stefan Barkaro, Akersberga (SE); Torbjorn Randahl, Nacka (SE)

(73) Assignee: Lantiq Deutschland GmbH, Neubiberg (DE)

( * ) Notice: Subject to any disclaimer, the term of this patent is extended or adjusted under 35 U.S.C. 154(b) by 626 days.

This patent is subject to a terminal disclaimer.

(21) Appl. No.: 12/845,024

(22) Filed: Jul. 28, 2010

(65) Prior Publication Data

US 2010/0289523 A1  Nov. 18, 2010

Related U.S. Application Data

(63) Continuation of application No. 10/821,781, filed on Apr. 9, 2004, now Pat. No. 7,839,993, and a continuation of application No. PCT/SE02/00168, filed on Oct. 11, 2002.

(30) Foreign Application Priority Data

Oct. 11, 2001 (SE) ........................ 0103414

(51) Int. Cl.
  H04M 1/00 (2006.01)
  H04M 9/00 (2006.01)
(52) U.S. Cl.
  USPC ..................... 379/390.04; 379/394
(58) Field of Classification Search
  USPC ............................ 379/394, 390.04
  See application file for complete search history.

(56) References Cited

U.S. PATENT DOCUMENTS

| 3,904,838 A | 9/1975 | Stewart |
| 5,448,182 A | 9/1995 | Countryman |
| 6,295,343 B1 | 9/2001 | Hjartarson |
| 2003/0031139 A1 | 2/2003 | Thilenius |
| 2005/0286710 A1 | 12/2005 | Barkaro |

FOREIGN PATENT DOCUMENTS

| EP | 0 323 586 A2 | 12/1988 |
| EP | 1 187 411 A2 | 3/2002 |
| EP | 1 195 913 A1 | 4/2002 |
| WO | WO 99/50970 | 7/1999 |

OTHER PUBLICATIONS

Office Actions, U.S. Appl. No. 10/821,781, Dated Dec. 16, 2008, Jun. 24, 2008, Dec. 21, 2009, May 14, 2009.

*Primary Examiner* — Alexander Jamal
(74) *Attorney, Agent, or Firm* — SpryIP, LLC

(57) ABSTRACT

In a line driver/receiver circuit where the line driver is connected with its output terminals to a load for supplying a transmit signal thereto and where the receiver is connected with its input terminals to the load for simultaneously receiving a receive signal therefrom, the transmit signal on the input terminals of the receiver is canceled by connecting the output terminals of the line driver to the load via equal complex sense impedances of an impedance value that is much smaller than the impedance value of the load impedance to match the load impedance, connecting the input terminals of the receiver to the load via equal first resistors and to respective output terminal of the line driver via equal second resistors, and providing transconductance amplifiers to sense the voltage across the sense impedances and supply corresponding currents to respective input terminal of the line driver.

15 Claims, 1 Drawing Sheet

US 8,588,403 B2

ECHO CANCELING ARRANGEMENT

CROSS REFERENCE TO RELATED APPLICATIONS

This application is a Continuation Application of co-pending application Ser. No. 10/821,781, which was filed on Apr. 9, 2004. The co-pending application is a Continuation Application of International Application No. PCT/SE02/0168 filed Sep. 18, 2002, which designated the United States and claims priority of Swedish Application No. 0103414-9 filed Oct. 11, 2001. This Application hereby claims the priority of each of the prior filed Applications and incorporates herein by reference the entire contents of each of the prior filed Applications.

TECHNICAL FIELD OF THE INVENTION

The invention relates generally to line driver/receiver circuits and more specifically to an echo canceling arrangement in such circuits.

BACKGROUND OF THE INVENTION

In many broadband applications such as Asymmetric Digital Subscriber Line (ADSL), a receive signal is received in a line driver/receiver circuit at the same time as a transmit signal is sent over one and the same transmission line.

The transmit signal that is much stronger than the receive signal that is damped by the transmission line, will be coupled with its distortion into the receiver and degrade the signal-to-noise ratio (SNR) of the receive signal.

Since the bitrate of the receive communication is decided in advance during a so-called training sequence by the detected SNR for the receive signal, also the bitrate of the receive signal will degrade.

To solve this problem, it is known to use echo cancellers.

FIG. 1 on the appended drawing is a schematic illustration of an embodiment of a known line driver/receiver circuit with an echo cancellation bridge.

The line driver 1 is connected with its output terminals via equal drive impedances ZT to a load impedance ZL that comprises a transformer connected to a transmission line that is connected to a subscriber station with a line driver/receiver circuit for transmitting and receiving signals to and from the transmission line.

The receiver 2 is connected with its input terminals to the load ZL for simultaneously receiving a receive signal from the transmission line.

To cancel the transmit signal and distortion on the input terminals of the receiver 2, the input terminals of the receiver 2 are connected to the load via equal resistors R1 and to respective output terminal of the line driver 1 via equal resistors R2.

In the embodiment in FIG. 1, the sum of the drive impedances 2ZT shall have the same impedance value as the load impedance ZL.

Since the output impedance of the line driver 1 is very low compared to the drive impedances ZT, no receive signal at all will be present at the interface between the line driver 1 and the resistor bridge R1, R2. However, at the interface between the resistor bridge R1, R2 and the load ZL both transmit and receive signals will be present.

It can be shown that by applying the resistor bridge R1, R2, the transmit signal can be totally canceled at the input terminals of the receiver 2 while the receive signal is still present.

In line drivers with active termination impedance, the drive impedance ZT in FIG. 1 would be set by a feedback loop inside the line driver 1. The advantage of such line drivers is that the output signal levels can be lowered for a given transmit power over the load ZL. Hereby, it will be possible to reduce the supply voltage and, consequently, the power consumption.

However, also in such line drivers, there is a need of good echo cancellation of transmit signals at the receiver input.

SUMMARY OF THE INVENTION

The object of the invention is to bring about good echo cancellation in line drivers/receiver circuits with active termination impedance.

This is attained by providing complex sense impedances to match the load impedance. The sense impedance value should be much smaller than the impedance value of the load impedance seen between the outputs of the line driver. Transconductance amplifiers are used for sensing the voltage across the sense impedances and supplying corresponding currents to respective input terminal of the line driver. To achieve echo cancellation a pure resistive bridge is applied across the sense impedances. The output of the bridge is connected to the receiver.

For example, in a line driver/receiver circuit where the line driver is connected with its output terminals to a load for supplying a transmit signal thereto and where the receiver is connected with its input terminals to the load for simultaneously receiving a receive signal therefrom, an arrangement is provided for canceling the transmit signal on the input terminals of the receiver, the output terminals of the line driver being connected to the load via equal first impedances, the input terminals of the receiver being connected to the load via equal first resistors and to respective output terminal of the line driver via equal second resistors, wherein the first impedances are complex impedances to match the load impedance and are of an impedance value that is much smaller than the impedance value of the load impedance, and transconductance amplifiers are provided to sense the voltage across the first impedances and supply corresponding currents to respective input terminal of the line driver.

A drive/termination impedance of the line driver may equal the impedance value of one of the impedances multiplied by k, wherein k is a function of the line driver gain and the transconductance amplifier gains.

Also, an echo canceling arrangement comprises a line driver having two inputs and two outputs, a load coupled with the outputs of the line driver via first and second impedances, a line receiver having two inputs, wherein the inputs are coupled through a network with the load and the outputs of said line driver, first and second transconductance amplifiers having two inputs and an output, wherein the inputs of the first transductance amplifier are coupled with the first impedance and its output with the one input of the line driver and the inputs of the second transductance amplifier are coupled with the second impedance and its output with the other input of the line driver, wherein the first impedances are complex impedances to match the load impedance and are of an impedance value that is much smaller than the impedance value of the load impedance.

The network may comprise a first resistor coupled between one input of the line receiver and the load, a second resistor coupled between the one input and one output of the line driver, a third resistor coupled between the other input of the line receiver and the load, and a fourth resistor coupled between the other input and the other output of the line driver. The first and third resistor may be equal and the second and fourth resistor may be equal. A drive/termination impedance of the line driver may equal the impedance value of one of the impedances multiplied by k, wherein k is a function of the line driver gain and the transconductance amplifier gains.

BRIEF DESCRIPTION OF THE DRAWINGS

The invention will be described more in detail below with reference to the appended drawing on which FIG. 1, described above, illustrates a known line driver/receiver circuit with an echo cancellation bridge.

DESCRIPTION OF THE INVENTION

Figure 2:
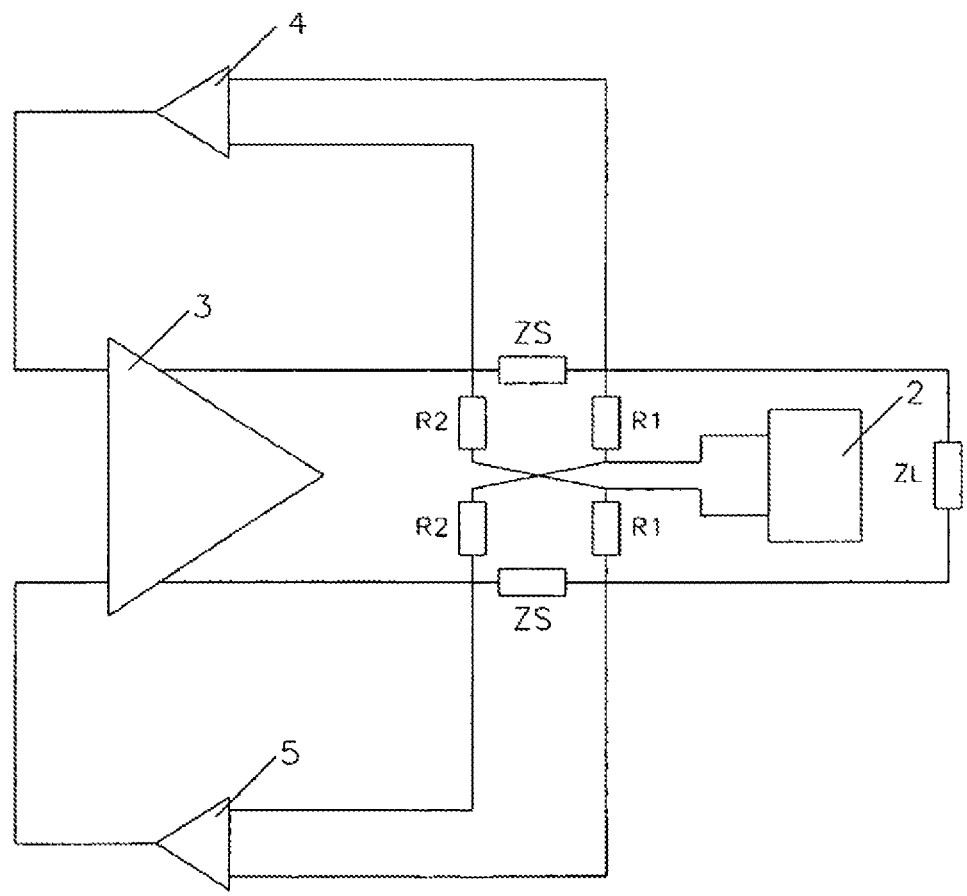
FIG. 2 illustrates a line driver/receiver circuit with active termination impedance with an echo cancellation arrangement according to the invention.

FIG. 2 illustrates a line driver/receiver circuit with active termination impedance with an echo cancellation arrangement according to the invention.

Figure 1:
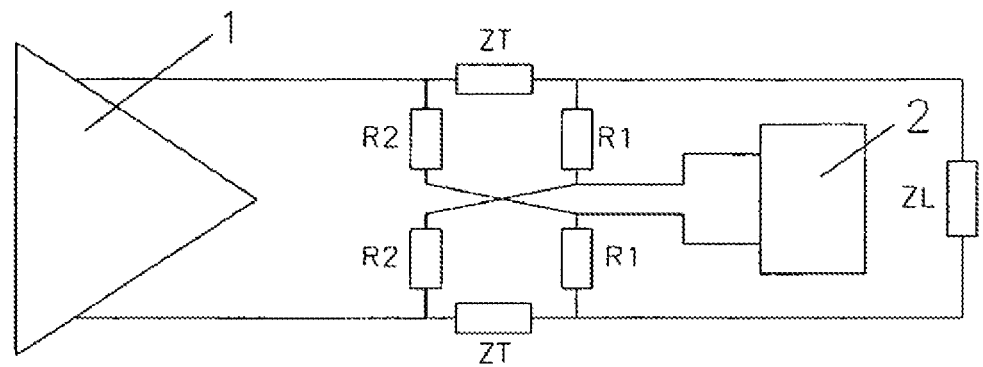

Components in FIG. 2 that are identical to components in FIG. 1 are provided with identical reference characters.

In accordance with the invention, a line driver 3 is connected with its output terminals via equal so-called sense impedances ZS to a load ZL that, in the same manner as in FIG. 1, comprises a transformer connected to a transmission line that is connected to a subscriber station with a line driver/receiver circuit for transmitting and receiving signals to and from the transmission line.

A receiver 2 is connected with its input terminals to the load ZL for simultaneously receiving a receive signal from the transmission line.

As in FIG. 1, the input terminals of the receiver 2 are connected to the load ZL via equal resistors R1 and to respective output terminal of the line driver 1 via equal resistors R2.

In accordance with the invention, the sense impedances ZS are complex impedances to match the load impedance ZL, and are of an impedance value that is much smaller than the impedance value of the load impedance ZL.

In accordance with the invention, the voltage across the respective sense impedance ZS is sensed by means of transconductance amplifiers 4, 5 that are connected with their input terminals across the respective sense impedance ZS, and with their output terminal to respective input terminal of the line driver 3.

The transconductance amplifiers 4, 5 generate output currents corresponding to the sensed voltage. These output currents are supplied to the respective input terminal of the line driver 3.

The drive/termination impedance of the line driver equals k×ZS, where k is a function of the gains of the line driver 3 and the transconductance amplifiers 4, 5. The drive/termination impedance is correctly matched to the load when k×ZS=ZL. Any combination of k and ZS that fulfills this equation can be chosen.

What is claimed is:

1. An apparatus, comprising:
a line driver having at least one output;
a receiver having at least one input, the at least one input of the receiver coupled to the at least one output of the line driver; and
a pure resistive bridge coupled to the line driver and the receiver.

2. The apparatus according to claim 1, wherein the pure resistive bridge includes four real resistors, two of the four real resistors being equal and the other two of the four real resistors being equal.

3. The apparatus according to claim 1, further comprising a load coupled to the receiver, the receiver including first and second inputs, and the first and second inputs of the receiver are coupled to the load.

4. The apparatus according to claim 3, wherein the pure resistive bridge includes at least two real resistors, a first of the at least two real resistors coupled between the first input and the load and a second of the at least two real resistors coupled between the second input and the load.

5. The apparatus according to claim 1, wherein the line driver includes first and second outputs and the receiver includes first and second inputs, and the pure resistive bridge includes at least two real resistors, a first of the at least two real resistors coupled between the first output and the first input and a second of the at least two real resistors coupled between the second output and the second input.

6. The apparatus according to claim 1, wherein the pure resistive bridge is between the line driver and the receiver.

7. The apparatus according to claim 1, wherein the pure resistive bridge includes four real resistors, the line driver includes a first and second output, and the receiver includes a first and second input.

8. The apparatus according to claim 7, wherein a first of the four real resistors is coupled to the first input of the receiver, a second of the four real resistors is coupled to the first output of the line driver, a third of the four real resistors is coupled to the second input of the receiver, and a fourth of the four real resistors is coupled the second output of the line driver.

9. The apparatus according to claim 1, further comprising a load coupled to the line driver and a sense impedance between the load and the line driver.

10. The apparatus according to claim 1, further comprising a complex sense impedance coupled to the at least one output of the line driver.

11. An apparatus, comprising:
a line driver having two outputs;
a first complex sense impedance coupled to a first of the two outputs;
a second complex sense impedance coupled to a second of the two outputs; and
a pure resistive bridge coupled to the two outputs of the line driver.

12. The apparatus according to claim 11, wherein the pure resistive bridge includes four real resistors, two of the four real resistors being equal and the other two of the four real resistors being equal.

13. The apparatus according to claim 11, further comprising a receiver having two inputs, a first of the two inputs coupled to the first output of the line driver and a second of the two inputs coupled to the second output of the line driver.

14. The apparatus according to claim 13, wherein the pure resistive bridge includes at least two real resistors, a first of the at least two real resistors coupled between the first output of the line driver and the first input of the receiver and a second of the at least two real resistors coupled between the second output of the line driver and the second input the receiver.

15. The apparatus according to claim 11, further comprising a receiver having two inputs and the pure resistive bridge includes four real resistors, a first of the four real resistors is coupled to a first input of the receiver, a second of the four real resistors is coupled to the first output of the line driver, a third of the four real resistors is coupled to a second input of the receiver, and a fourth of the four real resistors is coupled the second output of the line driver.

* * * * *